United States Patent
Maeda et al.

(10) Patent No.: US 10,648,101 B2
(45) Date of Patent: May 12, 2020

(54) SILICON WAFER

(71) Applicant: GLOBALWAFERS JAPAN CO., LTD., Niigata (JP)

(72) Inventors: Susumu Maeda, Niigata (JP); Hironori Banba, Niigata (JP); Haruo Sudo, Niigata (JP); Hideyuki Okamura, Niigata (JP); Koji Araki, Niigata (JP); Koji Sueoka, Okayama (JP); Kozo Nakamura, Okayama (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 0 days.

(21) Appl. No.: 16/096,745

(22) PCT Filed: Feb. 24, 2017

(86) PCT No.: PCT/JP2017/007177
§ 371 (c)(1),
(2) Date: Oct. 26, 2018

(87) PCT Pub. No.: WO2017/187752
PCT Pub. Date: Nov. 2, 2017

(65) Prior Publication Data
US 2019/0119828 A1    Apr. 25, 2019

(30) Foreign Application Priority Data
Apr. 27, 2016    (JP) .................................. 2016-089272

(51) Int. Cl.
*H01L 21/32*    (2006.01)
*H01L 21/322*    (2006.01)
(Continued)

(52) U.S. Cl.
CPC .............. *C30B 29/06* (2013.01); *C30B 33/02* (2013.01); *H01L 21/322* (2013.01); *H01L 21/324* (2013.01); *H01L 21/3225* (2013.01)

(58) Field of Classification Search
CPC ..... H01L 31/32; H01L 31/322; H01L 31/324; H01L 31/3225
(Continued)

(56) References Cited

U.S. PATENT DOCUMENTS

| | | | |
|---|---|---|---|
| 2003/0029375 A1* | 2/2003 | Watanabe | C30B 15/203 117/13 |
| 2004/0005777 A1 | 1/2004 | Qu et al. | |

(Continued)

FOREIGN PATENT DOCUMENTS

| | | |
|---|---|---|
| JP | 2005-311200 | 11/2005 |
| JP | 2007-534579 | 11/2007 |

(Continued)

OTHER PUBLICATIONS

International Search Report dated Mar. 21, 2017 in International (PCT) Application No. PCT/JP2017/007177.
(Continued)

*Primary Examiner* — Fazli Erdem
(74) *Attorney, Agent, or Firm* — Wenderoth, Lind & Ponack, L.L.P.

(57) ABSTRACT

A silicon wafer includes a denuded zone which is a surface layer and of which the density of vacancy-oxygen complexes which are complexes of vacancies and oxygen is less than $1.0 \times 10^{12}/cm^3$. An intermediate layer is disposed inwardly of the denuded zone so as to be adjacent to the denuded zone. The density of the vacancy-oxygen complexes in the intermediate layer increases gradually inwardly in the depth direction from the boundary with the denuded zone within a range of $1.0 \times 10^{12}/cm^3$ or over and less than (Continued)

$5.0\times10^{12}/cm^3$. The intermediate layer has a depth determined corresponding to the depth of the denuded zone. A bulk layer is disposed inwardly of the intermediate layer so as to be adjacent to the intermediate layer. The density of the vacancy-oxygen complexes in the bulk layer is $5.0\times10^{12}/cm^3$ or over.

12 Claims, 10 Drawing Sheets

(51) Int. Cl.
*C30B 29/06* (2006.01)
*C30B 33/02* (2006.01)
*H01L 21/324* (2006.01)

(58) Field of Classification Search
USPC .......................................................... 257/682
See application file for complete search history.

(56) References Cited

U.S. PATENT DOCUMENTS

| | | | |
|---|---|---|---|
| 2004/0102056 A1* | 5/2004 | Tobe | H01L 21/3225 438/795 |
| 2005/0005841 A1 | 1/2005 | Falster et al. | |
| 2007/0252239 A1* | 11/2007 | Maeda | H01L 21/3225 257/607 |
| 2008/0044669 A1* | 2/2008 | Adachi | H01L 21/76243 428/446 |
| 2008/0251879 A1* | 10/2008 | Adachi | H01L 21/26533 257/506 |
| 2009/0087632 A1* | 4/2009 | Schulze | H01L 21/26506 428/213 |
| 2010/0038757 A1* | 2/2010 | Isogai | C30B 29/06 257/655 |
| 2011/0042791 A1* | 2/2011 | Schulze | H01L 21/263 257/655 |
| 2016/0322233 A1* | 11/2016 | Nakayama | C30B 29/06 |
| 2018/0197751 A1* | 7/2018 | Koike | C30B 15/206 |

FOREIGN PATENT DOCUMENTS

| | | |
|---|---|---|
| JP | 2009-016864 | 1/2009 |
| JP | 2009-524227 | 6/2009 |
| KR | 10-2003-0066617 | 8/2003 |

OTHER PUBLICATIONS

International Preliminary Report on Patentability dated Oct. 30, 2018 in International (PCT) Application No. PCT/JP2017/007177.
Hallberg et al., "Enhanced oxygen precipitation in electron irradiated silicon", Journal of Applied Physics, vol. 72, No. 11, pp. 5130-5138, 1992.
Falster et al., "On the Properties of the Intrinsic Point Defects in Silicon: A Perspective from Crystal Growth and Wafer Processing", Phys. Status Solidi B, vol. 222, pp. 219-244, 2000.
Akatsuka et al., "Effect of Rapid Thermal Annealing on Oxygen Precipitation Behavior in Silicon Wafers" Jpn, J. Appl. Phys., vol. 40, pp. 3055-3062, 2001.

* cited by examiner

Processing temperature 1350°C
Oxygen partial pressure 100%

Cooling rate 120°C/S

Processing temperature 1350°C
Oxygen partial pressure 100%

Cooling rate 50°C/S

Processing temperature 1350°C
Oxygen partial pressure 100%

Cooling rate 25°C/S

Cooling rate 25°C/S
Oxygen partial pressure 0%

Processing temperature 1300°C

Cooling rate 25°C/S
Oxygen partial pressure 0%

Processing temperature 1275°C

Cooling rate 25°C/S
Oxygen partial pressure 0%

Processing temperature 1250°C

Cooling rate 120℃/S
Oxygen partial pressure 0%

Processing temperature 1300℃

Cooling rate 120℃/S
Oxygen partial pressure 0%

Processing temperature 1275℃

Cooling rate 120℃/S
Oxygen partial pressure 0%

Processing temperature 1250℃

SILICON WAFER

TECHNICAL FIELD

The present invention relates to a silicon wafer having a surface layer in which semiconductor devices are formed.

BACKGROUND ART

With an increasing degree of integration and increasing performance of today's semiconductor devices, higher quality is required for silicon wafers (hereinafter simply referred to as "wafers") used as substrates for semiconductor devices.

Specifically, it is required that a denuded zone (hereinafter referred to as the "DZ layer"), which forms the surface layer of the wafer in which semiconductor devices are formed, is completely free of oxygen precipitates which are compounds of silicon and oxygen that dissolves into the silicon crystal during growth of the silicon crystal from a crucible for storing silicon melt, and also completely free of void defects which are aggregates of vacancies introduced into the crystal during growth of the crystal. This is because oxygen precipitates could act as leak current sources and deteriorate the electrical properties of the semiconductor devices, while void defects could form dents in the surface of the wafer which could result in the breakage of wiring formed on the surface.

On the other hand, it is required that in the bulk layer, disposed deeper than the DZ layer, oxygen precipitates exist at a density higher than a predetermined level. This is because, while the oxygen precipitates in the DZ layer deteriorate, as explained above, the electrical properties of the semiconductor devices, the oxygen precipitates in the bulk layer serve as gettering sources to remove heavy metals that adhere to the surface of the wafer, thus improving the electrical properties of the device, and also increase the mechanical strength of the wafer by preventing dislocation that could cause plastic deformation during heat treatment of the wafer.

The density distribution of the oxygen precipitates in the wafer depth direction largely depends heavily on the distribution, in the wafer depth direction, of point defects (especially vacancies) that form during a high-temperature rapid thermal process (hereinafter abbreviated to "RTP") performed on wafers. In JP Patent Publication 2009-16864A, a wafer sliced from a crystal grown by the Czochralski process is subjected to RTP in an argon or hydrogen atmosphere (see paragraph 0037 of JP Patent Publication 2009-16864A). The wafer formed by such RTP is free of oxygen precipitates in the DZ layer, while oxygen precipitates exist in sufficient density in the bulk region of this wafer (see FIGS. 7A-8 of JP Patent Publication 2009-16864A).

Object of the Invention

As apparent from the photos of FIGS. 12-21 of JP Patent Publication 2009-16864A, the depth of the DZ layer, where no oxygen precipitates exist, is determined based on the results of evaluation of oxygen precipitates in the wafer, the evaluation being carried out using an infrared light scattering tomography apparatus. However, an infrared light scattering tomography apparatus is capable of detecting only oxygen precipitates of 25 nm in size or over, and is incapable of detecting any smaller oxygen precipitates. On the other hand, it is known that in semiconductor devices for an image sensor, oxygen precipitates that are smaller in size than the lower detection limit of an infrared light scattering tomography apparatus could cause pixel deficiencies of the image sensor called "white spot defects". It is therefore increasingly important to control minute oxygen precipitates that are not detectable with an infrared light scattering tomography apparatus.

SUMMARY OF THE INVENTION

An object of the present invention is to reduce oxygen precipitates in the DZ layer, while ensuring high gettering capability of the bulk layer.

Means for Achieving the Object

In order to achieve this object, the present invention provides a silicon wafer including a denuded zone which includes a surface of the silicon wafer and of which the density of vacancy-oxygen complexes which comprise complexes of vacancies and oxygen is less than $1.0 \times 10^{12}/\text{cm}^3$. An intermediate layer is disposed inwardly, in the depth direction of the silicon wafer, of the denuded zone so as to be adjacent to the denuded zone. The density of the vacancy-oxygen complexes in the intermediate layer increases gradually inwardly in the depth direction from the boundary with the denuded zone within a range of $1.0 \times 10^{12}/\text{cm}^3$ or over and less than $5.0 \times 10^{12}/\text{cm}^3$. The intermediate layer has a depth $t_I$ determined corresponding to the depth $t_{DZ}$ of the denuded zone. A bulk layer is disposed inwardly, in the depth direction of the silicon wafer, of the intermediate layer so as to be adjacent to the intermediate layer. The density of the vacancy-oxygen complexes in the bulk layer is $5.0 \times 10^{12}/\text{cm}^3$ or over.

The vacancy-oxygen complexes (hereinafter abbreviated to "VOx") are closely related to the precipitation behavior of oxygen precipitates, and by limiting the VOx density to less than $1.0 \times 10^{12}/\text{cm}^3$, it is possible to reliably reduce the precipitation of oxygen precipitations that could detrimentally affect the device properties. Further, by configuring the intermediate layer such that the VOx density in the intermediate layer increases continuously and steeply, within the range of $1.0 \times 10^{12}/\text{cm}^3$ to $5.0 \times 10^{12}/\text{cm}^3$, from the interface with the DZ layer inwardly in the depth direction, i.e., toward the bulk layer, where the VOx density is $5.0 \times 10^{12}/\text{cm}^3$ or over, it is possible to quickly guide heavy metals that have adhered to the surface of the DZ layer, to the bulk layer, and to reliably getter the heavy metals in the bulk layer. The VOx density distribution in the wafer depth direction can be estimated or measured by e.g., computer simulation or DLTS measurement after platinum diffusion treatment, but it is extremely troublesome to experimentally measure this value.

Preferably, the depth $t_{DZ}$ of the denuded zone and the depth $t_I$ of the intermediate layer are determined to satisfy the relation: $t_I \leq (2.6 t_{DZ} + 64)$ μm if the depth $t_{DZ}$ of the denuded zone is 3 μm or over and less than 10 μm.

Also preferably, the depth $t_{DZ}$ of the denuded zone (10) and the depth $t_I$ of the intermediate layer (11) are determined to satisfy the relation: $t_I \leq (0.3 t_{DZ} + 87)$ μm if the depth $t_{DZ}$ of the DZ layer is 10 μm or over and less than 100 μm.

By determining the upper limit of the depth $t_I$ of the intermediate layer in the above manner so that the distance between the denuded zone (DZ layer) and the bulk layer is short (which means that the VOx density in the intermediate layer rises steeply), oxygen precipitates in the bulk layer can efficiently getter heavy metals, and thus improve the electrical properties of semiconductor devices formed in the DZ layer.

Preferably, the depth $t_I$ of the intermediate layer is determined to satisfy the relation: 43 μm≤$t_I$ if the depth $t_{DZ}$ of the denuded zone is 10 μm or over and 100 μm or under.

By determining the lower limit of the depth of the intermediate layer in this manner, it is possible to prevent deterioration in device properties due to strain/stress resulting from a sharp increase in the density of oxygen precipitates from the DZ layer to the intermediate layer, while ensuring high gettering capability.

Preferably, the maximum value of the rates of change, in the depth direction of the silicon wafer, of the density of the vacancy-oxygen complexes in the intermediate layer is $5.0\times10^{11}/cm^3 \cdot \mu m$ or over.

By limiting the above maximum value to the above range, the density of the vacancy-oxygen complexes in the intermediate layer rises steeply, so that gettering can be performed effectively right under the DZ layer.

Advantages of the Invention

The silicon wafer according to the present invention comprises a denuded zone (DZ layer) which includes a surface of the silicon wafer and of which the density of vacancy-oxygen complexes (VOx) which comprise complexes of vacancies and oxygen is less than $1.0\times10^{12}/cm^3$; an intermediate layer disposed inwardly, in the depth direction of the silicon wafer, of the denuded zone so as to be adjacent to the denuded zone, wherein the density of the vacancy-oxygen complexes in the intermediate layer increases gradually inwardly in the depth direction from the boundary with the denuded zone within a range of $1.0\times10^{12}/cm^3$ or over and less than $5.0\times10^{12}/cm^3$, the intermediate layer having a depth $t_I$ determined corresponding to the depth $t_{DZ}$ of the denuded zone; and a bulk layer disposed inwardly, in the depth direction of the silicon wafer, of the intermediate layer so as to be adjacent to the intermediate layer, wherein the density of the vacancy-oxygen complexes in the bulk layer is $5.0\times10^{12}/cm^3$ or over.

By limiting the VOx density in the DZ layer within the above-defined range, thereby limiting oxygen precipitates in the DZ layer, and determining the VOx density in the bulk layer so as to be equal to or higher than the above-defined predetermined value, thereby producing oxygen precipitates at high density in the bulk layer to ensure high gettering capability, the device properties of semiconductor devices formed in the DZ layer improve.

EMBODIMENT OF THE INVENTION

Figure 1:
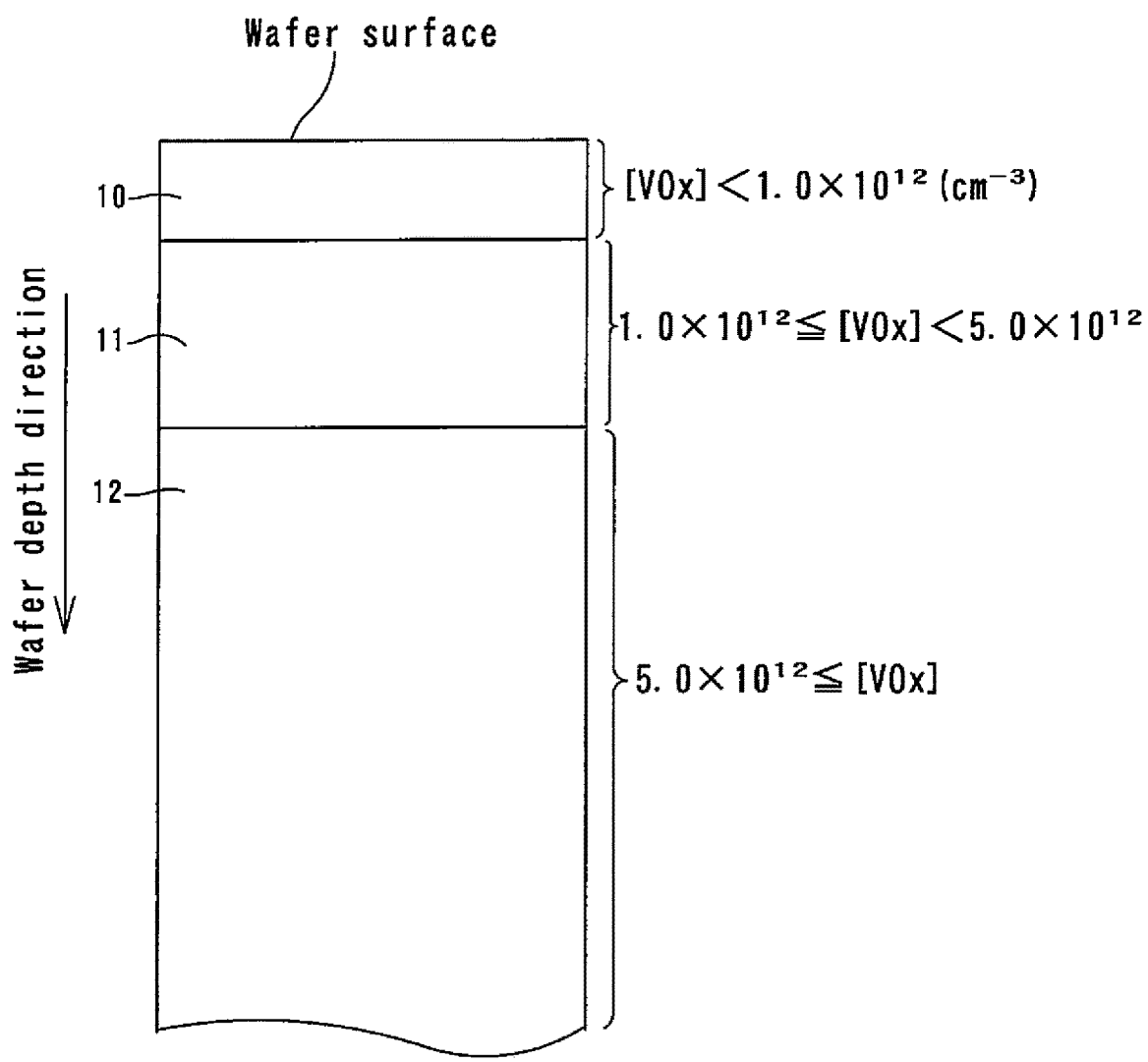
FIG. 1 is a vertical sectional view of a silicon wafer according to the present invention, illustrating its layer construction.

FIG. 1 shows a vertical sectional view of the silicon wafer (hereinafter simply referred to as the "wafer") according to the present invention. This wafer is sliced from an ingot grown by the Czochralski process. A mirror-finishing of both sides of the wafer, it is subjected to a rapid thermal process (RTP) comprising the below-described heat treatment sequence (shown in FIG. 4). The wafer has a surface layer comprising a denuded zone (hereinafter referred to as the "DZ layer") 10 of which the density of the vacancy-oxygen complexes (VOx), i.e., the complexes of vacancies and oxygen, is less than $1.0\times10^{12}/cm^3$. The depth of the DZ layer is determined corresponding to the kind of semiconductor devices formed on the wafer, and is typically within the range of 3-100 μm.

By limiting the VOx density of the DZ layer to less than $1.0\times10^{12}/cm^3$, oxygen precipitates, which could deteriorate the device properties, will not precipitate in the DZ layer 10 during the device manufacturing process. This ensures high performance of the semiconductor devices.

The wafer further includes an intermediate layer 11 disposed inwardly, in the depth direction of the wafer (direction of the arrow in FIG. 1), of the DZ layer 10 so as to be adjacent to the DZ layer 10. The intermediate layer 11 has a VOx density that increases gradually inwardly in the depth direction from the boundary with the DZ layer 10, within the range of $1.0 \times 10^{12}/cm^3$ or over and less than $5.0 \times 10^{12}/cm^3$. As described below, depth $t_I$ of the intermediate layer 11 is determined corresponding to depth $t_{DZ}$ of the DZ layer.

The intermediate layer 11 forms a transit region where the VOx density changes gradually from the DZ layer to a bulk layer 12, described later. Any heavy metals (pollution elements) that have adhered to the surface of the wafer during the device manufacturing process diffuse through the DZ layer 10 and the intermediate layer 11 into the bulk layer 12, and are gettered by oxygen precipitates in the bulk layer 12, so that such heavy metals are removed from the DZ layer 10 (as the device active region). In order for heavy metals to quickly diffuse into the bulk layer 12 and to be efficiently gettered there, it is basically preferable that the depth of the intermediate layer 11 is as small as possible, with the VOx density in the intermediate layer 11 increasing steeply from the boundary with the DZ layer 10 toward the boundary with the bulk layer 12. The effect of reducing the thickness of the intermediate layer 11 is especially remarkable with heavy metals that are low in diffusion coefficient in silicon crystals and thus are not easily movable by diffusion from the DZ layer 10 to the bulk layer 12 during the device manufacturing process (such heavy metals including molybdenum, tungsten and cobalt).

The bulk layer 12 is disposed inwardly, in the depth direction of the wafer, of the intermediate layer 11 so as to be adjacent to the intermediate layer 11, and has a VOx density of $5.0 \times 10^{12}/cm^3$ or over. During the device manufacturing process, oxygen precipitates of sufficient density to getter heavy metals precipitate in the bulk layer 12. For efficient gettering, the VOx density of the bulk layer 12 is preferably as high as possible. However, if it is too high and oxygen precipitates are produced excessively, the oxygen precipitates could cause slippage, thus reducing the strength of the wafer. Therefore, the VOx density of the bulk layer 12 is preferably $1.0 \times 10^{14}/cm^3$ or under.

Figure 2:
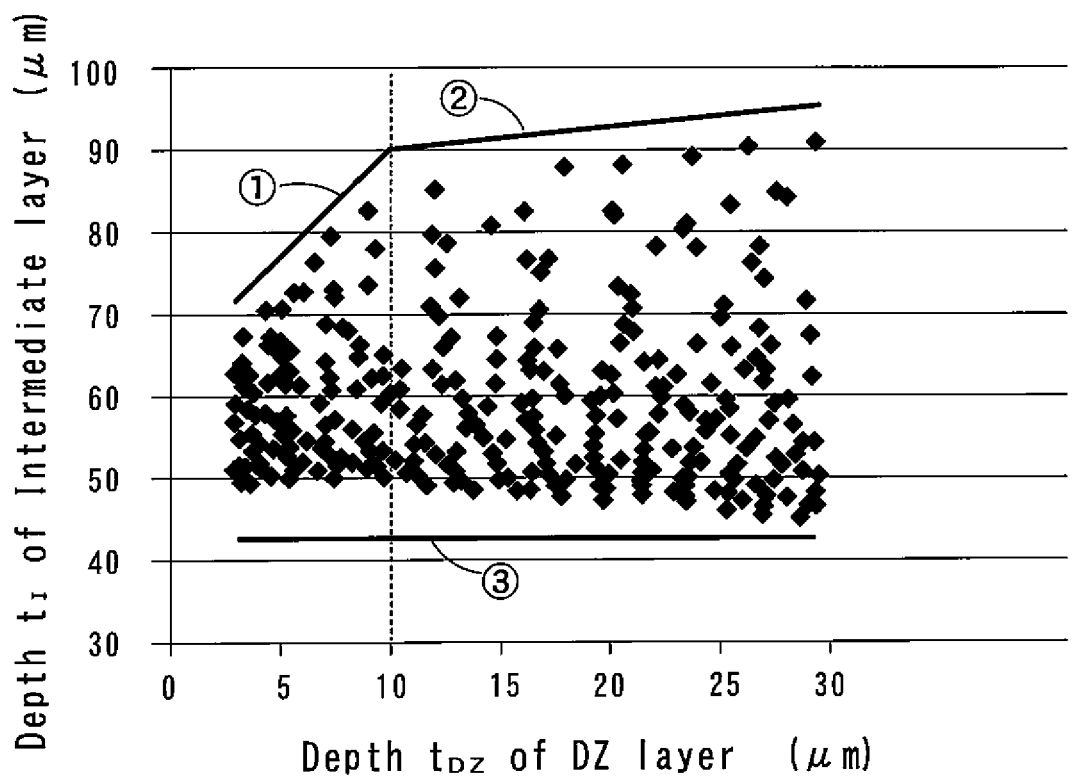
FIG. 2 shows the relationship between the depth of a DZ layer and the depth of an intermediate layer.

FIG. 2 shows the relationship between depth $t_{DZ}$ of the DZ layer 10 and depth $t_I$ of the intermediate layer 11. Depth $t_I$ of the intermediate layer 11 is determined corresponding to depth $t_{DZ}$ of the DZ layer 10, and preferably, as described later, it is determined such that the larger the depth $t_{DZ}$ of the DZ layer 10, the larger the depth $t_I$ of the intermediate layer 11.

As shown in FIG. 2, the relationship between depth $t_{DZ}$ of the DZ layer 10 and depth $t_I$ of the intermediate layer 11 is such that if depth $t_{DZ}$ of the DZ layer 10 is 3 μm or over and less than 10 μm, inequality: 43 μm $\leq t_I \leq (2.6 t_{DZ}+64)$ μm is met (see numbers 1 and 3 in circles in FIG. 2), and if depth $t_{DZ}$ of the DZ layer 10 is 10 μm or over, inequality: 43 μm $\leq t_I \leq (0.3 t_{DZ}+87)$ μm is met (see numbers 2 and 3 in circles in FIG. 2).

By limiting the upper limit of depth $t_I$ of the intermediate layer 11 so as to correspond to depth $t_{DZ}$ of the DZ layer 10, it is possible to reduce the distance between the DZ layer 10 and the bulk layer 12 (and thus to increase the rate at which the VOx density increases in the intermediate layer 11). By limiting the lower limit of depth $t_I$ of the intermediate layer 11, it is possible to prevent deterioration in device properties due to strain/stress resulting from a sharp increase in the density of oxygen precipitates from the DZ layer 10 to the intermediate layer 11.

The data points in FIG. 2 are obtained by first creating virtual wafers by performing simulations (described below) under the same conditions as the RTP sequences performed on actual wafers that showed favorable electrical properties when semiconductor devices were formed thereon (in such sequences, the RTP processing temperatures were within the range of 1250-1350° C., the ramp up rates were 75° C./second, the cooling rates were within the range of 20-150° C., and the oxygen partial pressures were within the range of 4-50%), and then plotting the relationships between depths $t_{DZ}$ of the DZ layers 10 and depths $t_I$ of the intermediate layers 11, of the respective virtual wafers. The data points all satisfy the above two inequalities.

In FIG. 2, the upper limit of depth $t_I$ of the intermediate layer 11 when depth $t_{DZ}$ of the DZ layer 10 is 10 μm or over (upper limit shown by number 2 in circle in FIG. 2) is not essential. The lower limit of depth $t_I$ of the intermediate layer 11 when depth $t_{DZ}$ of the DZ layer 10 is 3 μm or over is not essential either. Thus, the upper limit or both the upper and lower limits of depth $t_I$ of the intermediate layer 11 may be determined only when depth $t_{DZ}$ of the DZ layer 10 is within the range of 3 μm or over and less than 10 μm.

Figure 3A:
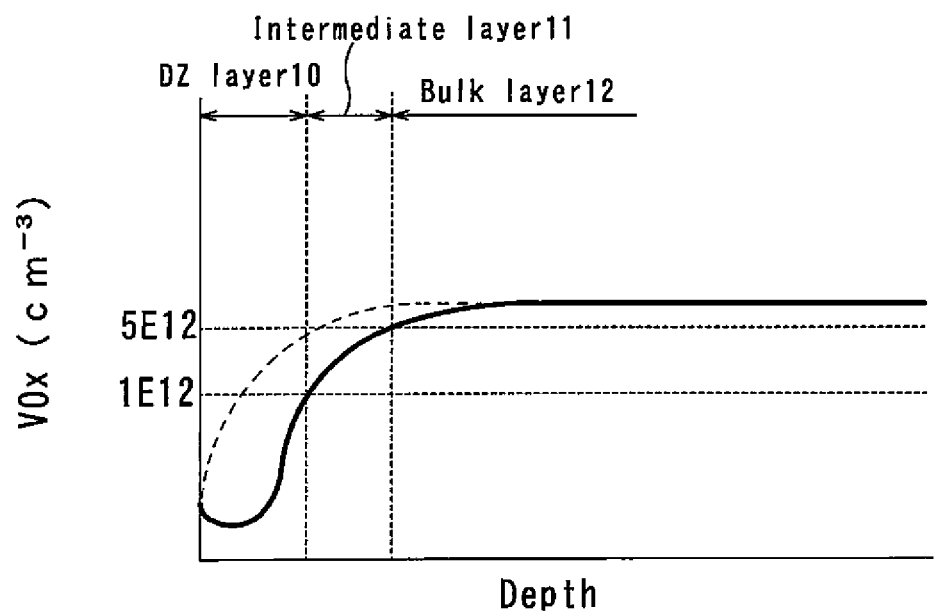
FIG. 3A shows the VOx distribution in a wafer according to the present invention, in the wafer depth direction.
Figure 3B:
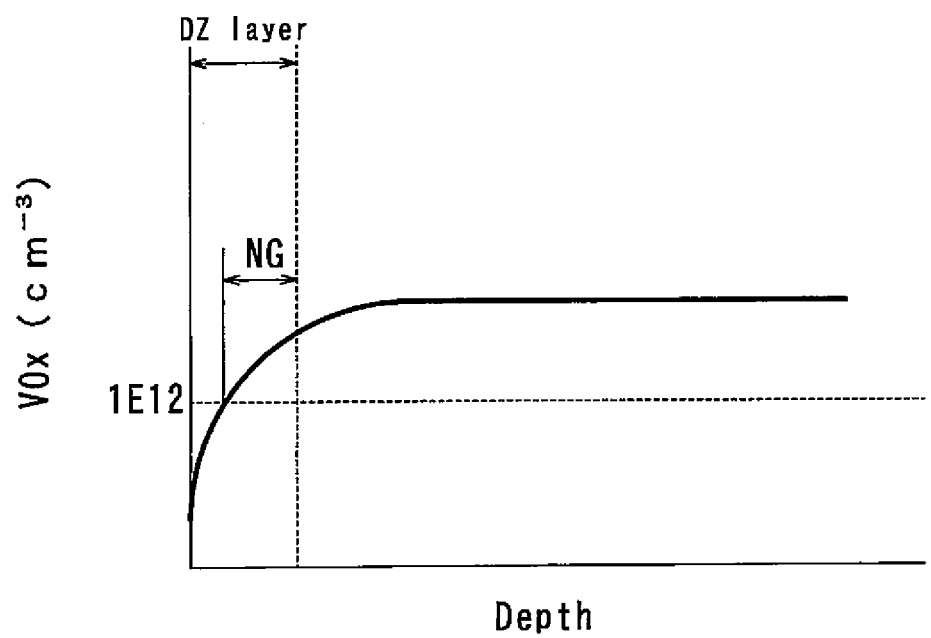
FIG. 3B shows the VOx distribution in a conventional wafer, in the wafer depth direction.

FIGS. 3A and 3B show the distributions of the VOx densities in the depth direction of a wafer according to the present invention and of a conventional wafer. In the conventional wafer, the DZ layer has a region (indicated by "NG" in FIG. 3B) where the VOx density is higher than $1.0 \times 10^{12}/cm^3$. In this region, minute oxygen precipitates appear, which could deteriorate the electrical properties of the high-performance device, such as its lifetime.

In contrast, in the wafer according to the present invention, the VOx density is less than $1.0 \times 10^{12}/cm^3$ over the entire depth of the DZ layer 10, so that fewer oxygen precipitates appear in the DZ layer 10. Moreover, since the VOx density increases steeply in the intermediate layer 11, efficient gettering is possible in the bulk layer 12, located inwardly of the intermediate layer 11 in the depth direction of the wafer. This ensures high performance of the semiconductor devices.

Figure 4:
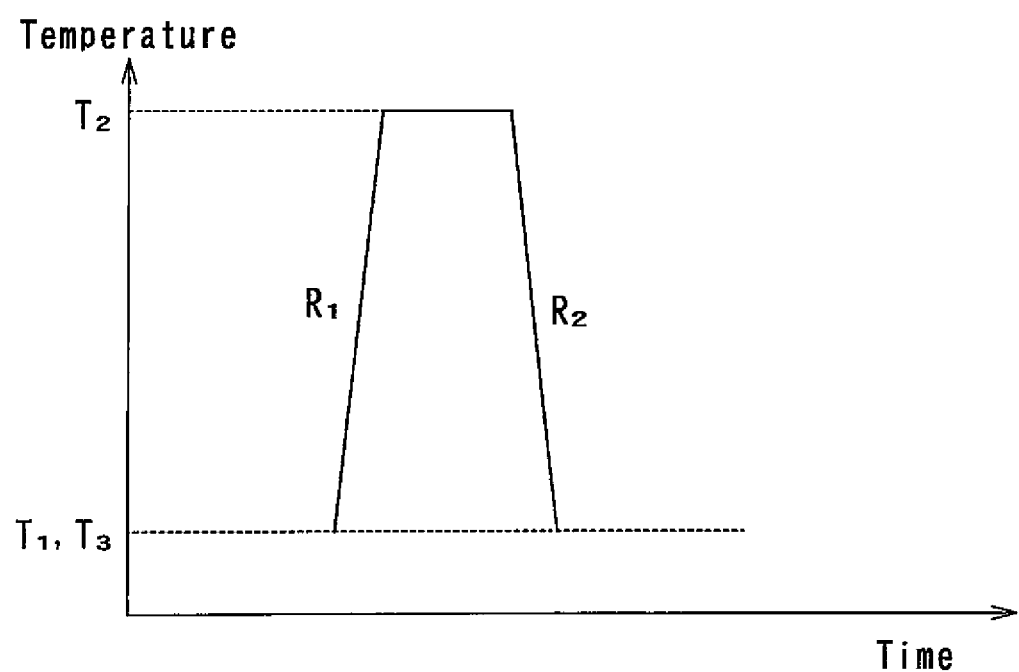
FIG. 4 shows an exemplary heat treatment sequence.

Exemplary rapid thermal process (RTP) sequences performed on wafers according to the present invention are illustrated in FIG. 4. The RTP sequences were performed using a ramp anneal furnace. During the RTP sequences, each wafer was heated from predetermined temperature $T_1$ (e.g., 700° C.) to processing temperature $T_2$ at predetermined ramp up rate $R_1$, kept at processing temperature $T_2$ for a predetermined period of time (e.g., 15 seconds), and cooled to predetermined temperature $T_3$ (e.g., 700° C.) at predetermined cooling rate $R_2$. The RTP sequences were carried out in an oxygen-containing atmosphere (with oxygen partial pressures within the range of 1% or over and 100% or less). By performing the RTP in an oxygen-containing atmosphere, an oxide film forms on the surface of the wafer during RTP, and interstitial silicon atoms are injected into the wafer through the interface between the oxide film and the wafer. The interstitial silicon atoms serve to reduce the VOx density of the wafer surface layer due to annihilation of the interstitial silicon atoms and vacancies introduced into the wafer by the RTP.

In order to evaluate the relationship between the VOx density distribution and the state of the actual oxygen precipitations, of each of the wafers formed by the above RTP sequences, the wafers after RTP were subjected to heat treatment for visualizing the oxygen precipitates (two-step heat treatment: 780° C. for three hours and 1000° C. for 16 hours), and after this heat treatment, the distribution of the oxygen precipitates in the wafer depth direction was evaluated using an infrared light scattering tomography apparatus ("MO441"; made by Raytex Corporation).

Figure 5A:
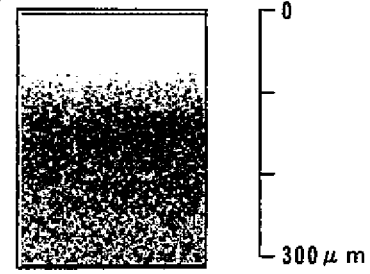
FIG. 5A shows the distribution of oxygen precipitates in the depth direction of the wafer when the processing temperature was 1350° C., the cooling rate was 120° C./sec, and the oxygen partial pressure was 100%.
Figure 5B:
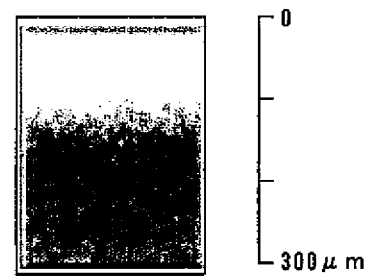
FIG. 5B shows the distribution of oxygen precipitates in the depth direction of the wafer when the processing temperature was 1350° C., the cooling rate was 50° C./sec, and the oxygen partial pressure was 100%.
Figure 5C:
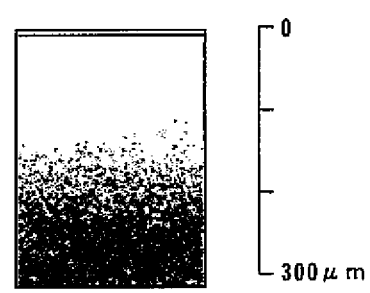
FIG. 5C shows the distribution of oxygen precipitates in the depth direction of the wafer when the processing temperature was 1350° C., the cooling rate was 25° C./sec, and the oxygen partial pressure was 100%.

The above RTP sequences and visualizing heat treatment are described in a more detailed manner. After processing wafers using sequences as shown in FIG. 4 (processing temperatures $T_2$: 1350° C.; ramp up rates $R_1$: 75° C./second; cooling rates: 120, 50 and 25° C./second; and oxygen partial pressures: 100%), the above-described visualizing heat treatment was performed to evaluate the distributions of oxygen precipitates in the wafer depth direction. FIGS. 5A-5C show the results of such evaluation when the cooling rates $R_2$ were 120° C., 50° C. and 25° C., respectively. The wafers subjected to the RTP sequences were formed with DZ layers 10 in which no oxygen precipitates are observed. The DZ layers 10 were such that the higher the cooling rates $R_2$, the shallower their depths were. Semiconductor devices were formed on the DZ layers 10 of the respective wafers shown in FIGS. 5A-5C to evaluate their electrical properties including lifetime. The evaluation results revealed that, while any of the wafers shown in FIGS. 5A-5C was up to standards, the properties of the wafers of FIGS. 5B and 5C were slightly inferior to those of the wafers of FIGS. 5A and 5C, respectively (which indicates that lower cooling rates $R_2$ result in inferior properties of the wafers). This is presumably because the lower the cooling rate $R_2$, the deeper the depth $t_{DZ}$ of the DZ layer 10, and thus the lower the gettering ability of the wafer tends to be.

The ramp up rate R1 is preferably 50° C. or over, more preferably 75° C. or over. This prevents growth of oxygen precipitate nuclei that are present in the wafer before RTP (they are generated during crystallization), and thus prevents oxygen precipitates from remaining in the DZ layer 10 as a result of the grown oxygen precipitates not completely melting while the heating temperature is held at the processing temperature during RTP.

Figure 6A:
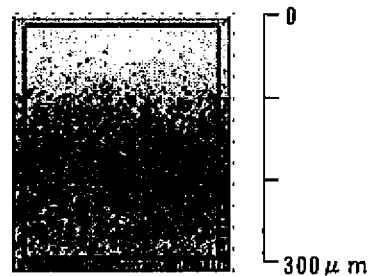
FIG. 6A shows the distribution of oxygen precipitates in the depth direction of the wafer when the processing temperature was 1300° C., the cooling rate was 25° C./sec, and the oxygen partial pressure was 0%.
Figure 6B:
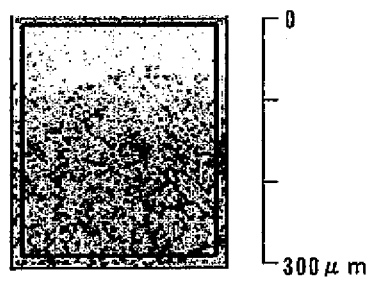
FIG. 6B shows the distribution of oxygen precipitates in the depth direction of the wafer when the processing temperature was 1275° C., the cooling rate was 25° C./sec, and the oxygen partial pressure was 0%.
Figure 6C:
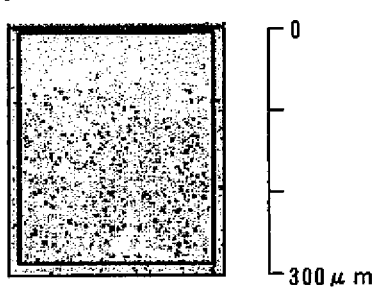
FIG. 6C shows the distribution of oxygen precipitates in the depth direction of the wafer when the processing temperature was 1250° C., the cooling rate was 25° C./sec, and the oxygen partial pressure was 0%.
Figure 7A:
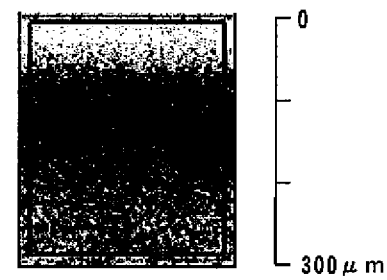
FIG. 7A shows the distribution of oxygen precipitates in the depth direction of the wafer when the processing temperature was 1300° C., the cooling rate was 120° C./sec, and the oxygen partial pressure was 0%.
Figure 7B:
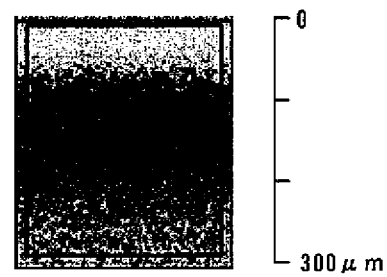
FIG. 7B shows the distribution of oxygen precipitates in the depth direction of the wafer when the processing temperature was 1275° C., the cooling rate was 120° C./sec, and the oxygen partial pressure was 0%.
Figure 7C:
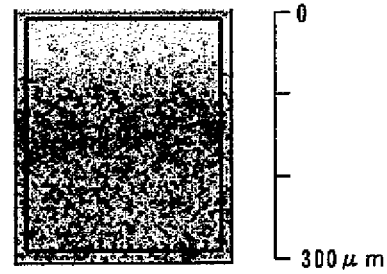
FIG. 7C shows the distribution of oxygen precipitates in the depth direction of the wafer when the processing temperature was 1250° C., the cooling rate was 120° C./sec, and the oxygen partial pressure was 0%.

Wafers were processed using RTP sequences shown in FIG. 4 but different from the sequences described above (processing temperatures $T_2$: 1300, 1275 and 1250° C.; ramp up rates $R_1$: 75° C./second; cooling rates: 120 and 25° C./second; and oxygen partial pressures: 0%). After these sequences, the above-described visualizing heat treatment was performed to evaluate the distributions of oxygen precipitates in the wafer depth direction. FIGS. 6A-6C show the results of such evaluation when the cooling rates $R_2$ were all 25° C./second, and the processing temperatures $T_2$ were 1300, 1275 and 1250° C., respectively, whereas FIGS. 7A-7C show the results of such evaluation when the cooling rates $R_2$ were all 120° C./second, and the processing temperatures $T_2$ were 1300, 1275 and 1250° C., respectively, Each of the wafers shown in FIGS. 6A-7C was also formed with a DZ layer 10 in which no oxygen precipitates are observed.

Semiconductor devices were formed on the DZ layers 10 of the respective wafers shown in FIGS. 6A-7C to evaluate their electrical properties including lifetime. As a result, problems such as shortened lifetime were found in all of the devices. This is presumably because minute (about 25 nm or under in size) oxygen precipitates undetectable with an ordinary detecting means such as an infrared scattering tomography apparatus were present in the apparently problem-free DZ layers 10, and these minute oxygen precipitates caused the problems of the semiconductor devices.

In order to evaluate the relationship between the VOx density distributions and the state of oxygen precipitations, of the wafers formed by the RTP sequences as shown in FIG. 4, simulations of the VOx density distributions in the wafer depth direction after RTP were performed. The simulations were based on a physics model taking into consideration the generation, diffusion and annihilation of vacancies and interstitial silicon atoms, and the formation of complexes of nitrogen and vacancies, and employ the thermal equilibrium concentration and diffusion coefficient of vacancies and interstitial silicon atoms which can accurately explain the behavior of vacancies and interstitial silicon atoms during growth of silicon crystals.

Figure 8:
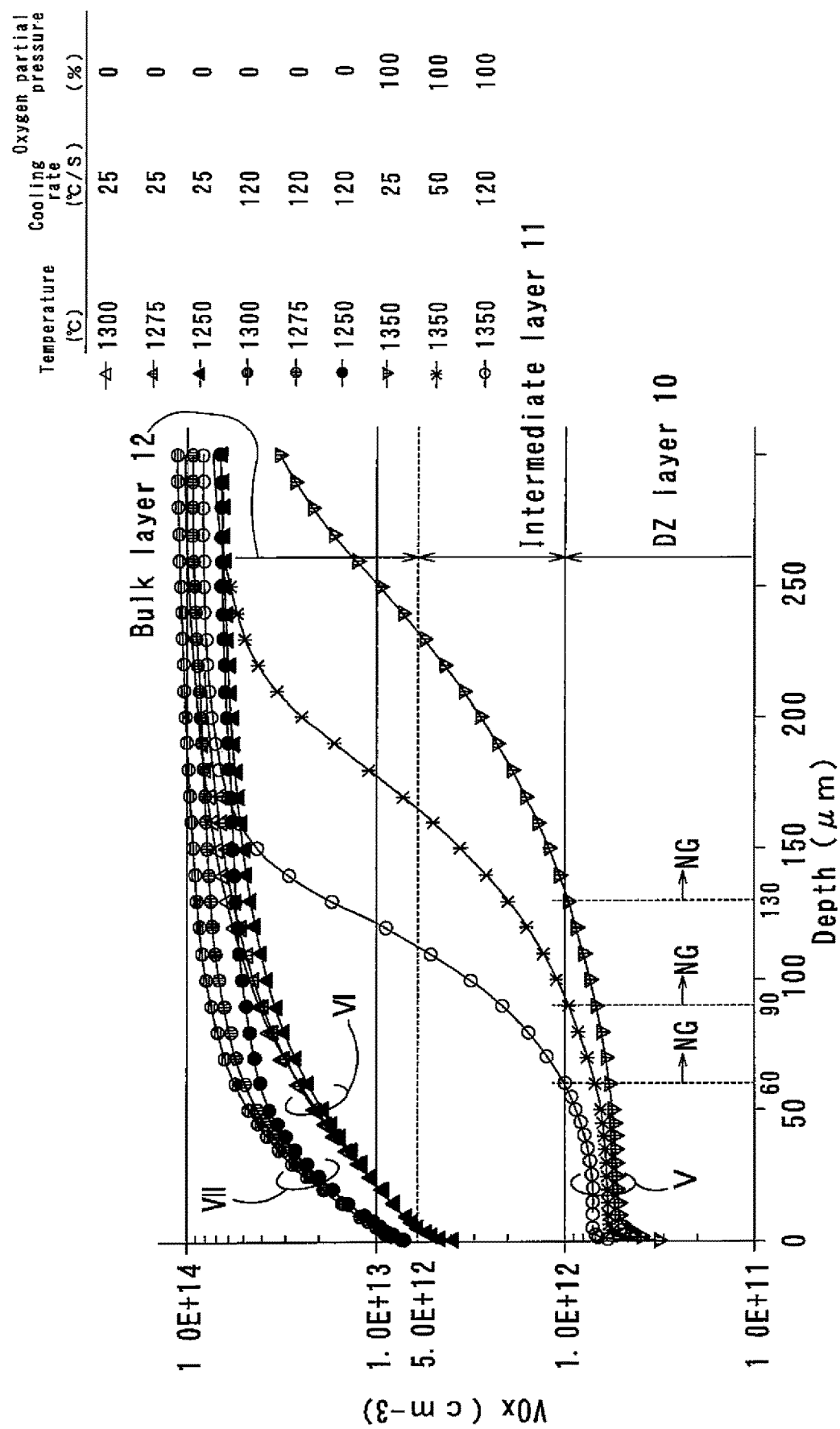
FIG. 8 shows simulation results of the VOx densities under the heat treatment conditions corresponding to FIGS. 5A-7C.

FIG. 8 shows the results of simulations of the VOx density distributions in the wafer depth direction when heat treatments were performed under the conditions corresponding to FIGS. 5A-7C. In FIG. 8, the simulation results indicated by "V" correspond to FIGS. 5A-5C, the simulation results indicated by "VI" correspond to FIGS. 6A-6C, and the simulation results indicated by "VII" correspond to FIGS. 7A-7C.

The simulation results indicated by VI and VII in FIG. 8 indicate that the higher the processing temperature $T_2$, the higher the VOx density is. This is because the higher the processing temperature, the higher the thermal equilibrium concentration is, and hence a greater number of VOx are "frozen" in the wafer by the RTP.

The simulation results indicated by V in FIG. 8 indicate that the higher the cooling rate $R_2$, the shallower the depth of the DZ layer 10, and the steeper the VOx density increasing curve is. This is because the higher the cooling rate $R_2$, the less time there is for vacancies to diffuse outwardly, i.e., toward the surface of the wafer, during RTP, so that the vacancy (i.e., VOx) density remains high in regions close to the surface of the wafer.

The comparison of the simulation results indicated by V in FIG. 8 with the simulation results indicated by VI and VII indicates that the DZ layer 10 is deeper when the RTP is performed in an oxygen containing atmosphere (with 100% oxygen partial pressure) than in an atmosphere in which there is no oxygen (0% oxygen partial pressure). This is because in an oxygen containing atmosphere, an oxide film forms on the surface of the wafer, and as a result, interstitial silicon atoms are injected into the surface layer of the wafer from the interface between the oxide film and the wafer, thus reducing the VOx density due to annihilation of vacancies and the interstitial silicon atoms.

Semiconductor devices were formed on the respective wafers of FIGS. 5A-5C, which were subjected to RTP in which the cooling rates $R_2$ were 120° C./sec (FIG. 5A), 50° C./sec (FIG. 5B), and 25° C./sec (FIG. 5C), respectively, in their regions close to their surfaces (i.e., shallower than about 60 μm). It was discovered that their electrical properties were all very good. Also, semiconductor devices were additionally formed, respectively, on the wafer subjected to RTP in which the cooling rate $R_2$ was 120° C./sec in its region deeper than about 60 μm (indicated by "NG" in FIG. 8), on the wafer subjected to RTP in which the cooling rate $R_2$ was 50° C./sec in its region deeper than about 90 μm (indicated by "NG" in FIG. 8), and on the wafer subjected to RTP in which the cooling rate $R_2$ was 25° C./sec in its region deeper than about 130 μm (indicated by "NG" in FIG. 8). Electrical properties of all of the additional semiconductor devices were all inferior. This is presumably because minute oxygen precipitates undetectable with an infrared scattering tomography apparatus were present in these "NG" regions, and these minute oxygen precipitates caused the deterioration of the electrical properties. Based on the above evaluation of the electrical properties, the region of the wafer where the VOx density is less than $1.0 \times 10^{12}/cm^3$ can be determined as the DZ layer 10, i.e., the layer that does not cause deterioration of the he electrical properties of the semiconductor devices.

The comparison of the evaluation results of oxygen precipitations in the wafer depth direction in FIGS. 5A-7C with the simulation results shown in FIG. 8 indicates that in the region where the VOx density is $5.0\times10^{12}/cm^3$, oxygen precipitates are present at high density, and thus confirms that the distribution of oxygen precipitations corresponds to the distribution of the VOx density in the depth direction. Based on the observed distribution of oxygen precipitates, the region where the VOx density is $5.0\times10^{12}/cm^3$ or over can be determined as the bulk layer 12, where oxygen precipitates are present at high density. Thus, the region of the wafer between the DZ layer 10 and the bulk layer 12, where the VOx density is $1.0\times10^{12}/cm^3$ or over and less than $5.0\times10^{12}/cm^3$, can be determined as the intermediate layer 11, where the VOx density increases toward the bulk layer 12.

Figure 9:
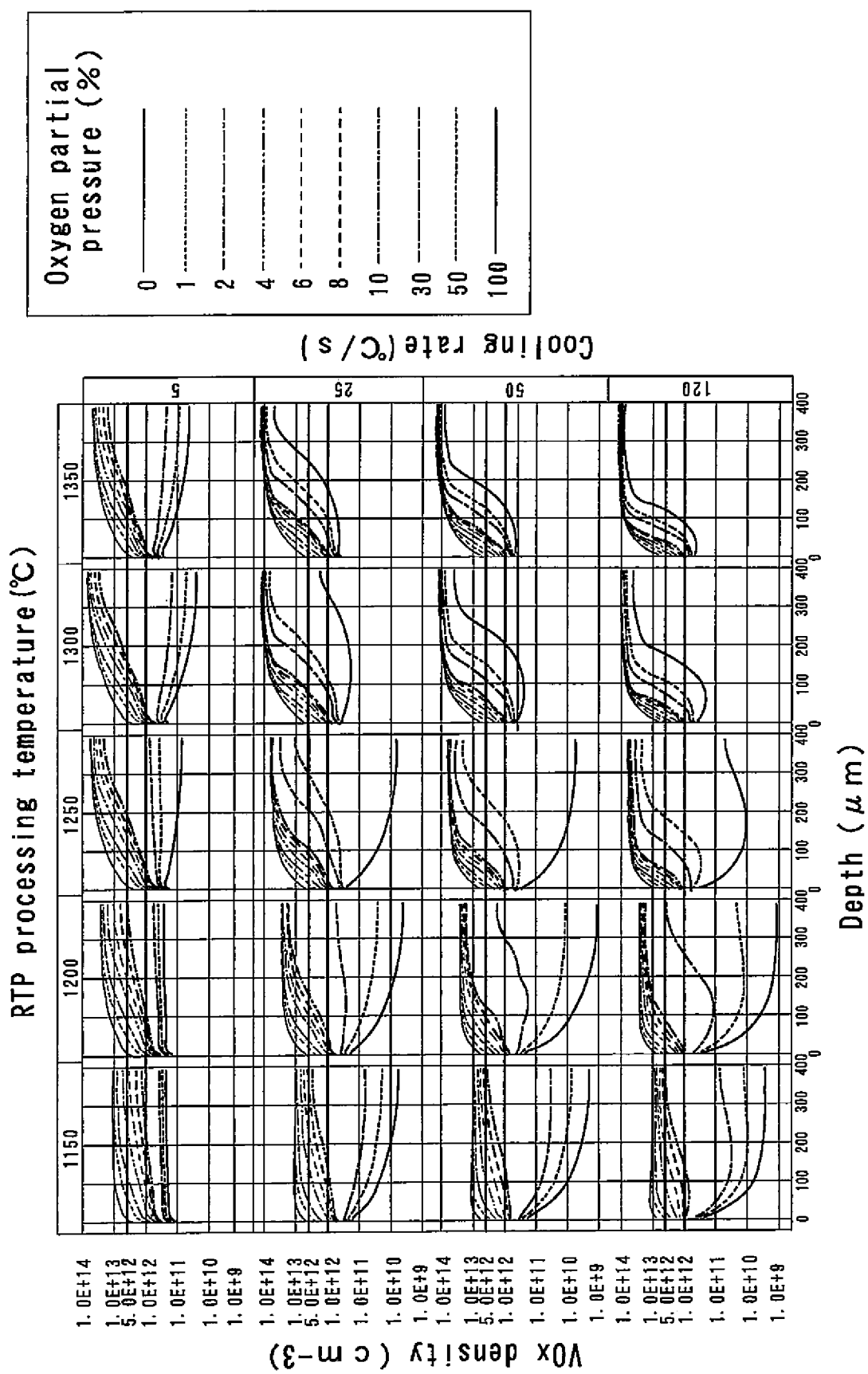
FIG. 9 shows simulation results of the VOx density distribution in the wafer depth direction for wafers subjected, respectively, to RTP's performed at five different processing temperatures within 1350-1150° C. (separated by 50° C.), at a ramp up rate of 75° C., at four different cooling rates of 120, 50, 25 and 5° C./sec, and at ten different oxygen partial pressures of 100, 50, 30, 10, 8, 6, 4, 2, 1 and 0%.
Figure 10:
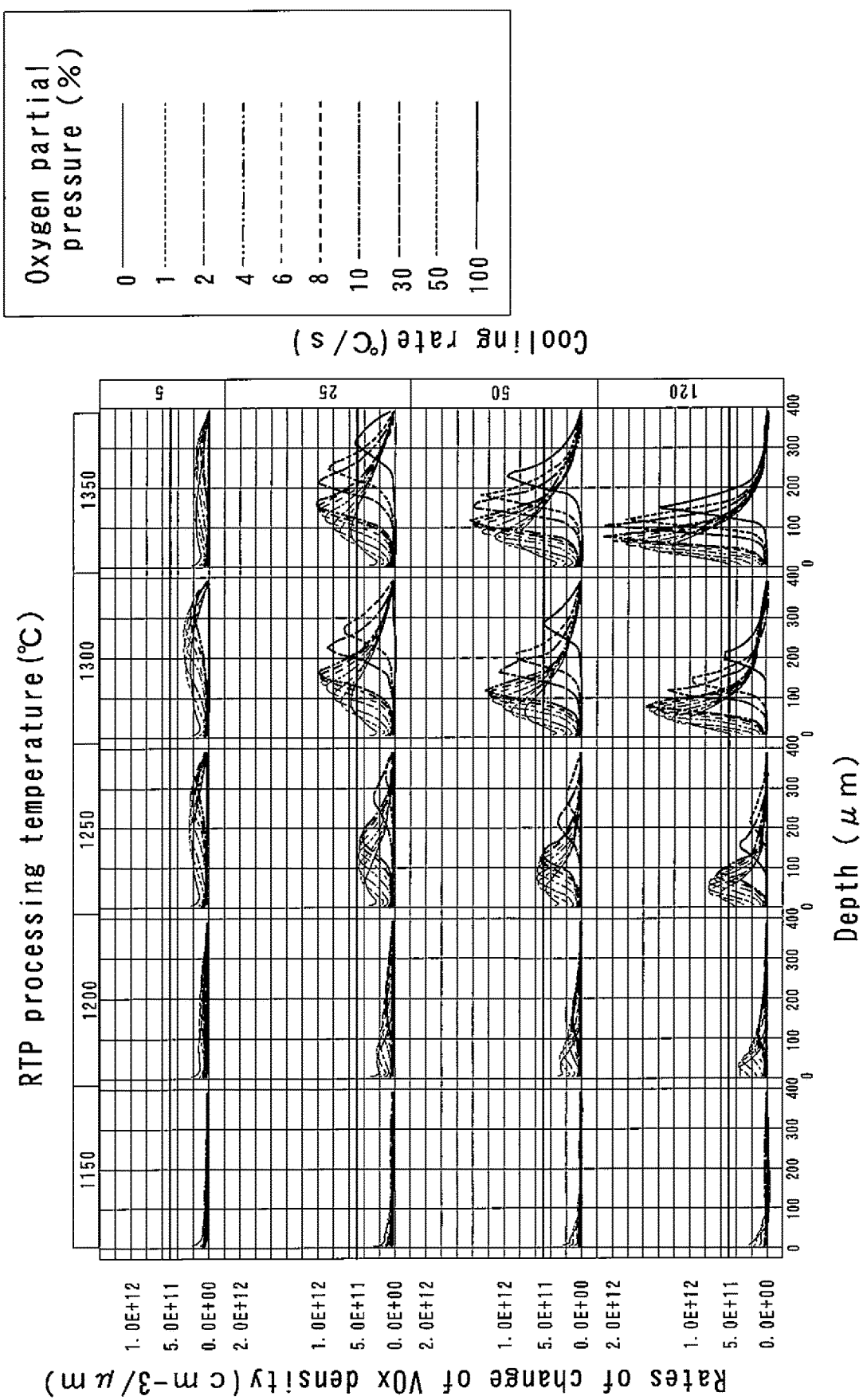
FIG. 10 shows the distribution of the rates of change (differential values) of the VOx density in the wafer depth direction in each simulation shown in FIG. 9.

FIG. 9 shows simulation results of the VOx density distribution in the wafer depth direction for wafers subjected, respectively, to RTP's performed at five different processing temperatures $T_2$ within 1350-1150° C. (separated by 50° C.), at a ramp up rate $R_1$ of 75° C., at four different cooling rates $R_2$ of 120, 50, 25 and 5° C./sec, and at ten different oxygen partial pressures of 100, 50, 30, 10, 8, 6, 4, 2, 1 and 0% (total of 200 RTP's). FIG. 10 shows the distribution of the rates of change (differential values) of the VOx density in the wafer depth direction in each simulation of FIG. 9.

According to the simulation results of FIG. 9, as with the results of FIG. 8, if the cooling rate R2 and the oxygen partial pressure are unchanged, the higher the processing temperature T2, the higher the VOx density is, though there are some exceptions. If the processing temperature T2 and the oxygen partial pressure are unchanged, the higher the cooling rate $R_2$, the higher the VOx density is. If the processing temperature $T_2$ and the cooling rate $R_2$ are unchanged, the higher the oxygen partial pressure, the lower the VOx density is.

If, as described above, the region where the VOx density is less than $1.0\times10^{12}/cm^3$ is determined as the DZ layer 10, the region where the VOx density is $1.0\times10^{12}/cm^3$ or over and less than $5.0\times10^{12}/cm^3$ is determined as the intermediate layer 11, and the region where the VOx density is $5.0\times10^{12}/cm^3$ or over is determined as the bulk layer 12, the conditions of the RTP determine whether or not the respective layers 10, 11 and 12 are formed by the RTP, and if they are formed, their thicknesses vary considerably with the conditions of the RTP.

As shown in FIG. 9, if, for example, the RTP is performed at the processing temperature $T_2$ of 1350° C., the ramp up rate $R_1$ of 75° C./sec, the cooling rate $R_2$ of 120° C./sec, and the oxygen partial pressure of 30%, a DZ layer 10 about 15 μm thick, and an intermediate layer 11 about 50 μm thick are formed in the wafer. If the RTP is performed at the processing temperature $T_2$ of 1350° C., the ramp up rate $R_1$ of 75° C./sec, the cooling rate $R_2$ of 50° C./sec, and the oxygen partial pressure of 10%, a DZ layer 10 about 4 μm thick, and an intermediate layer 11 about 59 μm thick are formed in the wafer.

On the other hand, if the RTP is performed at the processing temperature $T_2$ of 1350° C., the ramp up rate $R_1$ of 75° C./sec, the cooling rate $R_2$ of 120° C./sec, and the oxygen partial pressure of 10%, the DZ layer 10 is not formed, and if the RTP is performed at the processing temperature $T_2$ of 1350° C., the ramp up rate $R_1$ of 75° C./sec, the cooling rate $R_2$ of 5° C./sec, and the oxygen partial pressure of 30%, the intermediate layer 11 and the bulk layer 12 are not formed. Thus, in either case, the wafer cannot be used as a substrate for semiconductor devices.

By performing simulations using the processing conditions of RTP (processing temperature $T_2$, ramp up rate $R_1$, cooling rate $R_2$, and oxygen partial pressure) as parameters, it is possible to easily detect the VOx density distribution in the wafer depth direction, which is extremely difficult to detect directly. Thus, it is possible to easily determine the processing conditions for forming a wafer including a DZ layer 10 and an intermediate layer 11 having desired thicknesses.

According to the simulation results of FIG. 10, if the cooling rate $R_2$ and the oxygen partial pressure are unchanged, the higher the processing temperature $T_2$, the higher the maximum of the rates of change (differential values) of the VOx density in the wafer depth direction is, and the closer the position of the maximum value is to the surface of the wafer. Also, if the processing temperature $T_2$ and the oxygen partial pressure are unchanged, the higher the cooling rate $R_2$, the higher the maximum of the differential values is, and the closer the position of the maximum value is to the surface of the wafer. If the processing temperature $T_2$ and the cooling rate $R_2$ are unchanged, the maximum of the differential values is the highest when the oxygen partial pressure is around 10%, that is, the maximum of the differential values decreases as the partial oxygen pressure increases or decreases from 10%. Further, the higher the oxygen partial pressure, the closer the position of the maximum value is to the thickness center of the wafer.

The higher the maximum of the differential values, the more steeply the VOx density increases in the intermediate layer 11, so that it is possible to reduce the distance between the DZ layer 10 and the bulk layer 12 with the intermediate layer 11 disposed therebetween, which in turn reduces the distance by which heavy metals diffuse, thus allowing more efficient gettering. By positioning the maximum of the differential values close to the surface of the wafer, heavy metals that are low in diffusion coefficient and difficult to getter can be efficiently gettered. The maximum of the differential values is preferably $5.0\times10^{11}/cm^3 \cdot \mu m$ or over for effective proximity gettering.

FIGS. 9 and 10 show the results of simulations corresponding to RTP performed on wafers in a dry oxygen-containing atmosphere, but simulations can be made corresponding to RTP performed in a wet oxygen-containing atmosphere by suitably adjusting the oxide film forming speed.

The above-described sequences, shown in FIG. 4, are all conducted in the same atmosphere (oxygen-containing atmosphere containing oxygen of a predetermined partial pressure) from the ramp up step to the cooling step. However, they are mere examples, and it is possible to change the heat treatment atmosphere during the sequence. For example, an inert gas atmosphere may be used until the ramp up step, and an oxygen-containing atmosphere may be used during and after the processing temperature holding step. Alternatively, the oxygen partial pressure may be changed during the sequence. Further alternatively, during the processing temperature holding step, the processing temperature may be changed, and at the same time, the heat treatment atmosphere may be changed.

The above embodiments are mere examples, and provided the object of the invention is achieved, that is, if it is possible to reduce oxygen precipitates in the DZ layer 10 of the silicon wafer, while ensuring high gettering capability in the bulk layer 12, the layer construction of the wafer may be altered; for example, a film such as an oxide film may be formed on the surface of the wafer prior to RTP.

DESCRIPTION OF THE REFERENCE NUMERALS

10. Denuded zone (DZ layer)
11. Intermediate layer
12. Bulk layer

What is claimed is:

1. A silicon wafer comprising:
a denuded zone which includes a surface of the silicon wafer and of which a density of vacancy-oxygen complexes which comprise complexes of vacancies and oxygen is less than $1.0\times10^{12}/cm^3$;
an intermediate layer disposed inwardly, in a depth direction of the silicon wafer, of the denuded zone so as to be adjacent to the denuded zone, wherein the density of the vacancy-oxygen complexes in the intermediate layer increases continuously and steeply, within a range of $1.0\times10^{12}/cm^3$ to $5.0\times10^{12}/cm^3$, from an interface with the denuded zone inwardly in the depth direction of the silicon wafer, the intermediate layer having a depth $t_I$ determined corresponding to a depth $t_{DZ}$ of the denuded zone; and
a bulk layer disposed inwardly, in the depth direction of the silicon wafer, of the intermediate layer so as to be adjacent to the intermediate layer, wherein the density of the vacancy-oxygen complexes in the bulk layer is $5.0\times10^{12}/cm^3$ or over.

2. A silicon wafer comprising:
a denuded zone which includes a surface of the silicon wafer and of which a density of vacancy-oxygen complexes which comprise complexes of vacancies and oxygen is less than $1.0\times10^{12}/cm^3$:
an intermediate layer disposed inwardly, in a depth direction of the silicon wafer, of the denuded zone so as to be adjacent to the denuded zone, wherein the density of the vacancy-oxygen complexes in the intermediate layer increases gradually inwardly in the depth direction of the silicon wafer from a boundary with the denuded zone within a range of $1.0\times10^{12}/cm^3$ or over and less than $5.0\times10^{12}/cm^3$ the intermediate layer having a depth $t_I$ determined corresponding to a depth $t_{DZ}$ of the denuded zone; and
a bulk layer disposed inwardly, in the depth direction of the silicon wafer, of the intermediate layer so as to be adjacent to the intermediate layer, wherein the density of the vacancy-oxygen complexes in the bulk layer is $5.0\times10^{12}/cm^3$ or over,
wherein the depth $t_{DZ}$ of the denuded zone and the depth $t_I$ of the intermediate layer satisfy a relation: $t_I \leq (2.6t_{DZ}+64)$ μm if the depth $t_{DZ}$ of the denuded zone is 3 μm or over and less than 10 μm.

3. The silicon wafer of claim 2, wherein the depth $t_{DZ}$ of the denuded zone and the depth $t_I$ of the intermediate layer satisfy a relation: $t_I \leq (0.3t_{DZ}+87)$ μm if the depth $t_{DZ}$ of the denuded zone is 10 μm or over and less than 100 μm.

4. The silicon wafer of claim 3, wherein the depth $t_I$ of the intermediate layer satisfies a relation: 43 μm $\leq t_I$ if the depth $t_{DZ}$ of the denuded zone is 10 μm or over and 100 μm or under.

5. The silicon wafer of claim 1, wherein a maximum value of rates of change, in the depth direction of the silicon wafer, of the density of the vacancy-oxygen complexes in the intermediate layer is $5.0\times10^{11}/cm^3 \cdot$μm or over.

6. The silicon wafer of claim 2, wherein a maximum value of rates of change, in the depth direction of the silicon wafer, of the density of the vacancy-oxygen complexes in the intermediate layer is $5.0\times10^{11}/cm^3 \cdot$μm or over.

7. The silicon wafer of claim 3, wherein a maximum value of rates of change, in the depth direction of the silicon wafer, of the density of the vacancy-oxygen complexes in the intermediate layer is $5.0\times10^{11}/cm^3 \cdot$μm or over.

8. The silicon wafer of claim 4, wherein a maximum value of rates of change, in the depth direction of the silicon wafer, of the density of the vacancy-oxygen complexes in the intermediate layer is $5.0\times10^{11}/cm^3 \cdot$μm or over.

9. A silicon wafer comprising:
a denuded zone which includes a surface of the silicon wafer and of which a density of vacancy-oxygen complexes which comprise complexes of vacancies and oxygen is less than $1.0\times10^{12}/cm^3$;
an intermediate layer disposed inwardly, in a depth direction of the silicon wafer, of the denuded zone so as to be adjacent to the denuded zone, wherein the density of the vacancy-oxygen complexes in the intermediate layer increases gradually inwardly in the depth direction of the silicon wafer from a boundary with the denuded zone within a range of $1.0\times10^{12}/cm^3$ or over and less than $5.0\times10^{12}/cm^3$, the intermediate layer having a depth $t_I$ determined corresponding to a depth $t_{DZ}$ of the denuded zone; and
a bulk layer disposed inwardly, in the depth direction of the silicon wafer, of the intermediate layer so as to be adjacent to the intermediate layer, wherein the density of the vacancy-oxygen complexes in the bulk layer is $5.0\times10^{12}/cm^3$ or over,
wherein the depth $t_{DZ}$ of the denuded zone and the depth $t_I$ of the intermediate layer satisfy a relation: $t_I \leq (0.3t_{DZ}+87)$ μm if the depth $t_{DZ}$ of the denuded zone is 10 μm or over and less than 100 μm.

10. The silicon wafer of claim 9, wherein the depth $t_I$ of the intermediate layer satisfies a relation: 43 μm $\leq t_I$ if the depth $t_{DZ}$ of the denuded zone is 10 μm or over and 100 μm or under.

11. The silicon wafer of claim 9, wherein a maximum value of rates of change, in the depth direction of the silicon wafer, of the density of the vacancy-oxygen complexes in the intermediate layer is $5.0\times10^{11}/cm^3 \cdot$μm or over.

12. The silicon wafer of claim 10, wherein a maximum value of rates of change, in the depth direction of the silicon wafer, of the density of the vacancy-oxygen complexes in the intermediate layer is $5.0\times10^{11}/cm^3 \cdot$μm or over.

* * * * *